Feb. 8, 1966 M. V. BRAUNAGEL 3,234,433

ELECTRONIC CIRCUIT MODULE AND SYSTEM

Filed March 18, 1963

INVENTOR.

MAGNUS V. BRAUNAGEL

BY Philip H. Sheridan

ATTORNEY

United States Patent Office 3,234,433

Patented Feb. 8, 1966

3,234,433

ELECTRONIC CIRCUIT MODULE AND SYSTEM

Magnus V. Braunagel, Littleton, Colo., assignor to Space Technology and Research Corporation, Denver, Colo., a corporation of Colorado Filed Mar. 18, 1963, Ser. No. 269,227
8 Claims. (Cl. 317—101)

This invention relates to a modular package or mounting structure for electronic subsystem circuits and to complete circuit systems formed by stacking such modular structures containing the subsystem circuits.

Among the disadvantages found in some of the prior art modules and modular systems are the lack of flexibility. That is, it is difficult or inconvenient to alter or vary the circuit from one module to the next by correspondingly varying the circuit interconnections. Other modular systems do not make provision for externally checking the subsystem circuits and individual electronic components packaged in the various modules, after they have been assembled into the system. Some modular systems are so inflexible that defects in the subsystem circuits or individual components are not repairable and an entire module or system must be discarded and replaced. Still other modular systems have no provision for hermetically sealing the modules in the system from their atmosphere or environment.

Accordingly, it is an important object of this invention to provide a module construction which is highly flexible in that it facilitates making variations in the crcuit from one module to the next by making variations in the circuit interconnections.

Another object of this invention is to provide a module construction and modular system which permits external checking of the subsystem circuits and individual electronic components packaged in the various modules, after they have been assembled into the system.

A further object of this invention is to provide a modular system which is flexible in that defects in the subsystem circuits or individual components are repairable even after the modular system has been assembled or in operation for a time.

Still another object of this invention is to provide a modular system wherein each module can be hermetically sealed in the system from its atmosphere or environment.

Additional objects will become apparent from the following description of the invention, which is given primarily for purposes of illustration, and not limitation.

Stated in general terms, the objects of this invention are attained by providing an electronic module mounting construction or structure which comprises a side wall enclosure made of insulating material and shaped or arranged to form a cavity. The resulting cavity can have any suitable cross-section, such as square, rectangular, circular, elliptical, etc. An electronic component mounting means, such as a perforated board or socket, is located inside the cavity, preferably in transverse relationship with respect to the side wall enclosure.

The side walls of the side wall enclosure are provided with a plurality of conductors, preferably running the length of the side wall enclosure, and disposed in spaced relationship with respect to each other. External terminals are provided which pass through the side wall enclosure and are connected, respectively, to the conductors. Electronic components of a subsystem circuit are mounted on the mounting board, for example, with their leads interconnected to the conductors in the side wall enclosure so that the individual components can be checked electrically through the external terminals.

A more detailed description of a specific embodiment of the invention is given below with reference to the accompanying drawing, wherein.

Figure 2:
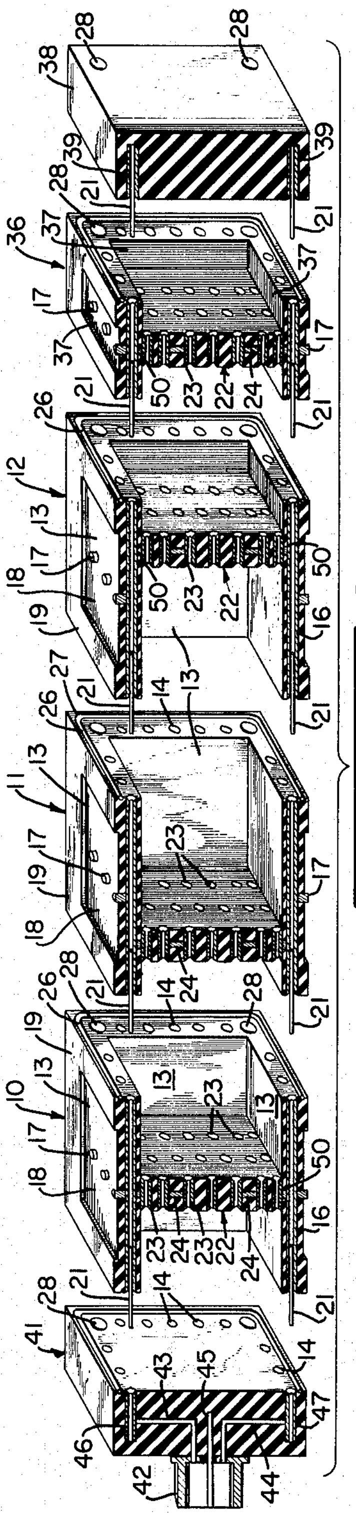
FIG. 2 is a similar view, in longitudinal section, showing the modular structures used in the package of FIG. 1, in exploded form, without electronic components or subsystem circuitry, and drawn to a larger scale than that of FIG. 1.

In the specific embodiment of the invention shown in the drawing, the side wall enclosure of each of the three modules 10, 11 and 12, consists of four similar square walls 13. The walls 13 are made of a suitable electrical insulating material such as a suitable resin, plastic, ceramic, glass or like material. Referring to module 10, for simplicity in describing the electronic circuit module of the specific embodiment shown in the drawing, it will be seen that the side walls 13 form a side wall enclosure which encloses four sides of a cavity or chamber.

Figure 3:
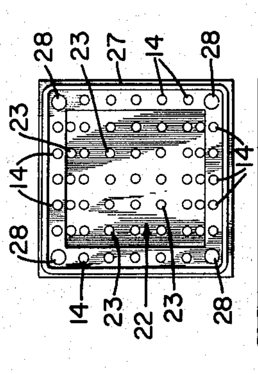
FIG. 3 is an end view showing the configuration of the modular structures of FIG. 2.

Each of the side walls 13 is provided with a series of spaced, elongate holes 14 which run the full length of the side wall. Each of the holes 14 is lined with a tubular conductor 16. Electrically connected to the middle of each tubular conductor 16 is a terminal 17, which serves as a test and checkout point. Terminals 17 extend a short distance through a recessed area 18, and are approximately flush with a border 19, of side walls 13. Each side wall 13, as best shown in FIG. 3, contains five holes 14 and tubular conductors 16, or a total of twenty for each module.

Removable interconnecting conductor pins 21 are tightly fitted into the ends of tubular conductors 16. When adjacent modules are stacked, or assembled, the pins 21, projecting from one end of one of the modules (such as module 11) are tightly fitted into the respective, corresponding tubular conductors 16 of the adjacent module (module 10) to electrically interconnect the two stacked modules (10 and 11).

An electronic component mounting means, such as a perforated or apertured board 22 (module 10) is positioned in the cavity formed by walls 13, transversely and at right angles to the side wall enclosure of the cavity. Board 22 also is made of electrical insulating material similar to that of which walls 13 are made. As best shown in FIG. 3, each board 22 is provided with a regular pattern of thirty-five perforations or apertures 23. Perforations 23 are lined with short tubular conducting material sections running the full thickness of the board 22. Certain pairs of these conducting material sections 23 are electrically interconnected by connectors 24 in acccordance with a predetermined pattern. As shown in the figures a connector 50 is provided between tubular members 16 and 23 to connect installed circuitry with rods 21.

At one end of the side wall enclosure of each module, formed by side walls 13, is suitably mounted a resilient seal ring 26 made of a suitable elastomeric or synthetic resin material. At the other end of the side wall enclosure is formed a cooperating seal ring recess or groove 27 with O-ring 26 sealed therein as shown in FIGS. 2 and 3. Recess or groove 27 is dimensioned to receive a seal ring 26 from the adjacent module, and under pressure forms a hermetic seal therewith, for each of the module cavities. Each module is provided with four, corner bolt holes 28 running through the full length of the side wall enclosure.

Figure 4:
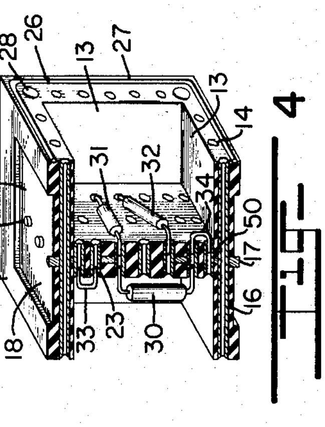
FIG. 4 is an isometric view, in longitudinal section, showing one of the modular structures of FIG. 2 containing electronic components and subsystem circuitry mounted therein.

Each module, such as module 10 for example, is provided with the particular electronic components, such as components 30, 31 and 32 shown in FIG. 4. Certain of the leads of components 30, 31 and 32, as shown, are plugged or connected into certain of the tubular sections 23. Certain others of the tubular sections 23 are interconnected by conductors or wires 33 and 34. In this manner module 10 is provided with a particular, desired subsystem circuit. Modules 11 and 12 are provided with similar subsystem circuits, or stages in the case of a logic or computer system.

Figure 1:
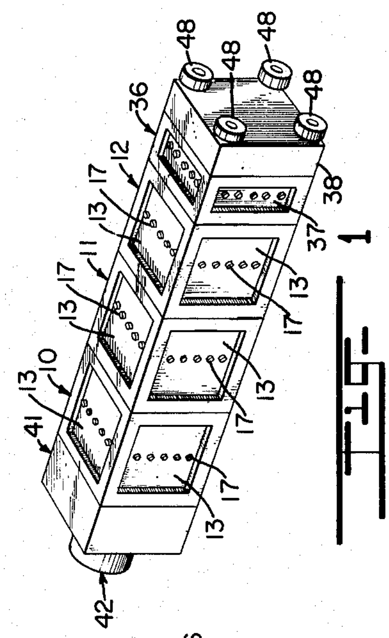
FIG. 1 is an isometric view showing a stacked module checked electrically through the external terminals.

Module 36, FIGS. 1 and 2, is about half as long as modules 10, 11 and 12, respectively. It has rectangular side walls 37. In other respects it is similar to modules 10, 11 and 12. Module 38 is attached to the one end of the modular package, as shown in FIG. 1, and by means of interconnecting pins 21, and tubular connectors 39, serves to electrically interconnect the circuit subsystems of the other modules. Module 41 is attached to the other end of the modulator package. By means of input-output plug 42, the subcircuit consisting of conductors 43, 44 and 45, and tubular connectors 46 and 47, which are connected to pins 21 of module 10, convenient electrical connections are provided to all of the modular subcircuits through standard connectors.

After all of the modules of the package are provided with the desired electronic components, mounted and connected in the predetermined manner, and all of the modules are interconnected via pins 21 in the predetermined sequence, long bolts or screws (not shown) are passed through aligned holes 28, and the entire package is fastened and hermetically sealed together, as shown in FIG. 1, by suitably tightening nuts 48 on the threaded ends of the long bolts.

It will be seen that in the resulting package shown in FIG. 1, individual electronic components, such as components 30, 31 and 32 (FIG. 4), can be checked or tested externally of the package, for each module, through terminals 17, without disassembling the package. Defective modules can be removed, or repaired and replaced in the package with great ease and convenience, and without discarding such modules. Removable pins 21 permit circuit alteration and interconnection, and the various electronic circuits can be pre-packaged and assembled as desired.

The modular circuits are highly reliable in that they are pre-welded and incapsulated in the center section of the module. The modules, by virtue of the seal rings 26 and seal ring recesses 27, are self-sealing to form airtight seals between joined modules. Also, the individual modules can be polarized to prevent misassembly, and each module can be indexed in increments of 90 degrees.

The electronic circuit modules and systems of this invention can be applied to computers, servo-mechanisms, magnetic amplifiers, amplifiers, military electronics systems, missiles, aircraft, underwater instrumentation, sounding rockets, and like devices. Although the specific embodiment of the invention described and illustrated hereinabove is directed to a package and module of particular, single, linear construction, it will be understood that parallel, multiple construction can be employed.

Obviously, many other modifications and variations of the electronic circuit module and system of the present invention are possible in the light of the teachings given hereinabove. It is, therefore, to be understood that, within the scope of the appended claims, the invention can be practiced otherwise than as specifically described and illustrated hereinabove.

What is claimed is:

1. An electronic module mounting structure comprising a side wall enclosure of insulating material arranged to form a cavity, component mounting means of dielectric material disposed in the cavity having rows of tubular conducting inserts mounted therein, a plurality of conductors dispased in spaced relationship in the side wall enclosure, means for interconnecting opposed corresponding conductors through said rows, and external terminal means connected respectively to the conductors through the side wall enclosure.

2. An electronic module mounting structure comprising a side wall enclosure of insulating material arranged to form a cavity, a plurality of tubular conductors running the length of the side wall enclosure disposed in spaced relationship with each other therein, terminal means connected to each of the conductors through the side wall enclosure and extending exteriorly thereof, a component mounting board of dielectric material positioned in the cavity in transverse relationship with respect to the side wall enclosure having rows of spaced tubular conducting inserts mounted therein, continuous electrical connecting means through said rows between corresponding opposed tubular conductors, whereby circuit components interconnected between selected rows can be individually tested through said terminals.

3. An electronic module mounting structure comprising a side wall enclosure of insulating material arranged to form a cavity, a plurality of tubular conductors running the length of the side wall enclosure disposed therein in spaced relationship with respect to each other, terminal means connected to each of the conductors through the side wall enclosure and extending exteriorly thereof, a component mounting board of dielectric material positioned in the cavity in transverse relationship with respect to the side wall enclosure, said board having a plurality of rows of spaced tubular conducting inserts mounted therein, electronic components of a subsystem circuit mounted on said board with leads thereof passing through inserts in selected rows, and continuous electrical connecting means through said selected rows between opposed corresponding terminals, whereby the individual components interconnected in said selected rows can be checked through said terminal means.

4. An electronic module mounting structure comprising a side wall enclosure of insulating material arranged to form a cavity, a plurality of tubular conductors running the length of the side wall enclosure and disposed in spaced relationship with respect to each other therein and adapted to receive interconnecting pins for selective electrical connection to adjacent modules to provide a predetermined circuit interconnection, terminal means connected to each of the tubular conductors through the side wall enclosure and extending exteriorly thereof, a component mounting board of dielectric material positioned in the cavity in transverse relationship with respect to the side wall enclosure, said board having a plurality of rows of tubular conducting inserts mounted therein, continuous electrical connecting means through said rows between opposed corresponding tubular conductors, and electronic components of a subsystem circuit mounted on said board with leads thereof connected to tubular inserts in selected rows of the mounting board so that the individual components interconnected in said selected rows can be checked through said terminal means.

5. A stacked module electronic circuit system composed of a group of electronic module mounting structures according to claim 3, each electrically interconnected from end-to-end with each other by conducting rods selectively interconnecting corresponding tubular conductors of adjacent modules to provide a predetermined circuit interconnection, an end module interconnected with the one end module of the stack for providing electrical interconnections in the circuit system, and another end module interconnected with the other end module of the stack and provided with an input-output plug and subcircuit.

6. A stacked module electronic circuit system composed of a group of electronic module mounting structures according to claim 4, each electrically interconnected from end-to-end with each other as defined, each of said module mounting structures being provided with a seal ring means at one end of said side wall enclosure and seal ring recess means at the other end of the said side wall enclosure for hermetically sealing adjacent module mounting structures together, an end module interconnected and hermetically sealed with the one end module of the stack for providing electrical interconnections in the circuit system, and another end module interconnected and hermetically sealed with the other end module of the stack and provided with an input-output plug and subcircuit.

7. An electronic module mounting structure comprising a side wall enclosure of insulating material arranged to form a cavity, a component mounting means of dielectric material disposed in the cavity having spaced conductor elements mounted therein, a plurality of elongated conductors disposed in spaced relationship in said side wall enclosure, external terminal means connected respectively to said elongated conductors through said side wall enclosure, and conducting connector means between said conductor elements and said elongated conductors.

8. An electronic module mounting structure comprising a side wall enclosure of insulating material arranged to form a cavity, component mounting means of dielectric material disposed in the cavity having conducting inserts mounted therein, a plurality of elongated rod-like conductors disposed in spaced relationship in said side wall enclosure, means for electrically interconnecting said conducting inserts to each other and to said elongated conductors, and external terminal conducting means connected respectively to said elongated conductors through said side wall enclosure.

References Cited by the Examiner

UNITED STATES PATENTS

| | | | |
|---|---|---|---|
| 2,783,416 | 2/1951 | Butler | 317—101 |
| 2,821,669 | 1/1958 | Christian | 317—101 |
| 2,907,926 | 10/1959 | Slack | 317—101 |
| 2,967,267 | 1/1961 | Steinman et al. | 317—101 |
| 3,029,368 | 4/1962 | Wulc | 317—101 |
| 3,054,024 | 9/1962 | Van Dillen et al. | 317—101 |

JOHN F. BURNS, *Primary Examiner.*

JOHN P. WILDMAN, DARRELL L. CLAY, *Examiners.*